(12) United States Patent
Haass et al.

(10) Patent No.: US 8,283,194 B2
(45) Date of Patent: Oct. 9, 2012

(54) METHOD FOR APPLYING LAYERS ONTO THERMOELECTRIC MATERIALS

(75) Inventors: Frank Haass, Erzhausen (DE); Madalina Andreea Stefan, Ludwigshafen (DE); Georg Degen, Lorsch (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 12/840,693

(22) Filed: Jul. 21, 2010

(65) Prior Publication Data

US 2011/0020969 A1 Jan. 27, 2011

(30) Foreign Application Priority Data

Jul. 27, 2009 (EP) .................................. 09166445

(51) Int. Cl.
*H01L 27/16* (2006.01)
(52) U.S. Cl. .......... 438/55; 136/201; 136/203; 257/470; 438/107; 438/455
(58) Field of Classification Search .................. 136/239, 136/201, 205; 438/666, 54
See application file for complete search history.

(56) References Cited

U.S. PATENT DOCUMENTS

| | | | |
|---|---|---|---|
| 3,261,079 A | 7/1966 | Clingman, Jr. | |
| 3,650,844 A | 3/1972 | Kendall, Jr. et al. | |
| 3,781,176 A * | 12/1973 | Penn et al. | 136/212 |
| 4,149,025 A * | 4/1979 | Niculescu | 136/206 |
| 4,493,939 A * | 1/1985 | Blaske et al. | 136/212 |
| 4,611,089 A * | 9/1986 | Elsner et al. | 136/230 |
| 5,436,467 A * | 7/1995 | Elsner et al. | 257/15 |
| 5,439,528 A | 8/1995 | Miller | |
| 5,448,109 A | 9/1995 | Cauchy | |
| 6,818,470 B1 * | 11/2004 | Acklin et al. | 438/55 |
| 2008/0121263 A1 | 5/2008 | Schutte et al. | |
| 2008/0245397 A1 * | 10/2008 | Moczygemba et al. | 136/201 |
| 2008/0289677 A1 * | 11/2008 | Bell et al. | 136/236.1 |
| 2010/0024437 A1 * | 2/2010 | Elsner et al. | 62/3.2 |
| 2010/0229911 A1 * | 9/2010 | Leavitt et al. | 136/239 |
| 2010/0269879 A1 * | 10/2010 | Leavitt et al. | 136/205 |

FOREIGN PATENT DOCUMENTS

| | | |
|---|---|---|
| EP | 1 102 334 A2 | 5/2001 |
| WO | WO 2008/061823 | 5/2008 |

OTHER PUBLICATIONS

George S. Nolas, et al., "Recent Developments in Bulk Thermoelectric Materials," MRS Bulletin, vol. 31, No. 3, Mar. 2006, 11 pages.
International Search Report issued Dec. 27, 2010, in PCT/EP2010/060696.

* cited by examiner

*Primary Examiner* — Steven Loke
*Assistant Examiner* — David Goodwin
(74) *Attorney, Agent, or Firm* — Oblon, Spivak, McClelland, Maier & Neustadt, L.L.P.

(57) ABSTRACT

A method for applying at least one layer, selected from diffusion barriers, further protective layers, adhesion promoters, solders and electrical contacts, onto thermoelectric materials, is characterized by the fact that the at least one layer is rolled or pressed onto the thermoelectric material at a temperature at which the thermoelectric material is flowable.

20 Claims, 1 Drawing Sheet

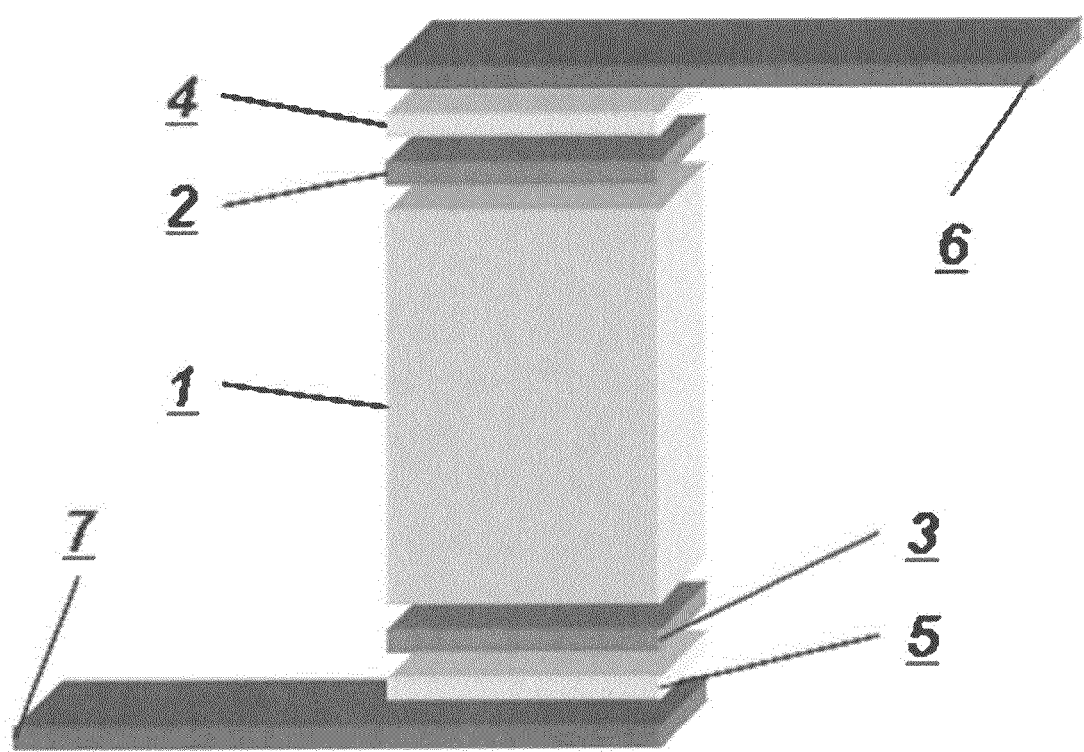

METHOD FOR APPLYING LAYERS ONTO THERMOELECTRIC MATERIALS

The invention relates to a method for applying at least one layer, selected from diffusion barriers, further protective layers, adhesion promoters, solders and contacts, onto thermoelectric materials.

Thermoelectric generators and Peltier arrangements as such have been known for a long time. p- and n-doped semiconductors which are heated on one side and cooled on the other side transport electrical charges through an external electric circuit, and electrical work can be performed at a load in the electric circuit. The efficiency of the conversion of heat into electrical energy that is achieved in the process is limited thermodynamically by the Carnot efficiency. Thus, at a temperature of 1000 K on the hot side and 400 K on the "cold" side, an efficiency of (1000-400): 1000=60% would be possible. However, only efficiencies of up to 6% have been achieved to date.

On the other hand, if a direct current is applied to such an arrangement, then heat is transported from one side to the other side. Such a Peltier arrangement works as a heat pump and is therefore suitable for cooling apparatus parts, vehicles or buildings. Heating via the Peltier principle is also more favorable than conventional heating because more heat is always transported than corresponds to the energy equivalent supplied.

A good overview of effects and materials is given by e.g. S. Nolan et al., Recent Developments in Bulk Thermoelectric Materials, MRS Bulletin, Vol. 31, 2006, 199-206.

At present, thermoelectric generators are used in space probes for generating direct currents, for cathodic corrosion protection of pipelines, for energy supply to light buoys and radio buoys, and for operating radios and television sets. The advantages of thermoelectric generators reside in their extreme reliability. For instance, they work independently of atmospheric conditions such as air humidity; there is no disturbance-prone mass transfer, but rather only charge transfer; the fuel is combusted continuously, including catalytically without a free flame, as a result of which only small amounts of CO, NO and uncombusted fuel are released; it is possible to use any fuels from hydrogen through natural gas, gasoline, kerosene, diesel fuel up to biologically obtained fuels such as rapeseed oil methyl ester.

Thermoelectric energy conversion thus fits extremely flexibly into future requirements such as hydrogen economy or energy generation from renewable energies.

BRIEF DESCRIPTION OF THE DRAWINGS

FIG. 1 shows a schematic illustration of the construction of a contact connection establishing the physical connection between the material in the heart of the component and the outside world.

An essential element of thermoelectric components is the electrical contact-connection. The contact-connection establishes the physical connection between the material in the "heart" of the component (which is responsible for the desired thermoelectric effect of the component) and the "outside world". In detail, the construction of such a contact is illustrated schematically in FIG. 1.

The thermoelectric material 1 within the component provides for the actual effect of the component. This is a thermoelectric leg. A thermal current flows through the material 1, which produces the movement of electrons and hence an electric current flow, in order that said material fulfils its purpose in the overall construction.

The material 1 is connected to the supply lines 6 and 7 via the contacts 4 and 5, respectively, on at least two sides. In this case, the layers 2 and 3 are intended to symbolize one or more intermediate layers which may be necessary (barrier material, solder, adhesion promoter or the like) between the material 1 and the contacts 4 and 5. The segments 2/3, 4/5, 6/7 respectively associated with one another in pairs can, but need not, be identical. This ultimately likewise depends on the specific construction and the application, just like the flow direction of electric current and thermal current through the construction.

An important role is accorded, then, to the contacts 4 and 5. The latter provide for a close connection between material and supply line. If the contacts are poor, then high losses occur here, which can severely restrict the performance of the component. For this reason, the contacts are frequently also pressed onto the material. The contacts are thus subjected to high mechanical loading. This mechanical loading also increases as soon as elevated (or else reduced) temperatures or/and thermal cycling play a part. The thermal expansion of the materials incorporated in the component leads inevitably to mechanical stress, which leads in the extreme case to failure of the component as a result of detachment of the contact.

In order to prevent this, the contacts used must have a certain flexibility and spring properties in order that such thermal stresses can be compensated for.

Thermoelectric materials have to be provided with a series of layers in order to be able to integrate the said materials into modules or components. Said layers are firstly diffusion barriers that prevent progressive contamination of the thermoelecric material by ion migration from layers situated at higher levels. Further protective layers, solder layers and contact promoters follow until the electrical contact with the adjacent leg within the module is finally established by a metal bridge.

These layers are normally applied step by step. Conventional technologies are vapor deposition and sputtering, the application of liquid solders, etc.

In this case, consideration is given to coating and contact-connection of individual legs, and also application on a larger material slice, which is subsequently cut up small to form individual legs. These legs can then be soldered to one another, for example.

Disadvantages include the high expenditure in respect of time and costs owing to the progressive application of the layers and owing to the treatment of individual legs.

It is an object of the present invention to provide a method for applying such layers onto thermoelectric materials which can be carried out in a manner that does not involve a high outlay, preferably continuously, and which avoids disadvantages of the existing methods.

The object is achieved according to the invention by means of a method for applying at least one layer, selected from diffusion barriers, further protective layers, adhesion promoters, solders and electrical contacts, onto thermoelectric materials, wherein the at least one layer is rolled or pressed onto the thermoelectric material at a temperature at which the thermoelectric material is malleable or flowable or ductile.

The thermoelectric material can be deformed during the application of the layers.

The thermoelectric material is softened to a degree that can be deformed plastically and be connected with the at least one layer under pressure. In this sense the terms "malleable" or "flowable" are to be understood.

The method according to the invention permits the production of coated materials in a continuous process, which materials can be incorporated directly into thermoelectric modules after a simple cutting process.

Preferably, the at least one layer is placed onto the thermoelectric material in the form of a film or a film stack prior to rolling or pressing.

The underlying concept consists in covering the thermoelectric material with the necessary coatings in the form of films and compressing the layers with the thermoelectric material under pressure and, if appropriate, with thermal treatment in one work process to form a "sandwich". In this case, the compression should be effected at a temperature at which the thermoelectric material is malleable or flowable. This may be necessary in order that the semiconductor material, which is normally more or less brittle, does not break.

The suitable temperature is chosen depending on the respective theremoelectric material. Preferably, the temperature for PbTe lies in a range of 400 to 900° C., particularly preferably 500 to 750° C.

The pressures that are to be applied during pressing or rolling should be dimensioned such that the layers to be applied are connected to the thermoelectric material in a fixedly adhering manner. The pressures that typically prevail during pressing or rolling are set. Preferably, the pressure lies in the range of 0 to 100 MPa, particularly preferably in the range of 1 to 30 MPa.

Preferably, the functional barrier, if appropriate further protective layers, adhesion promoters, solders and/or electrical contacts are applied simultaneously onto the thermoelectric material in one work process. For this purpose, it is particularly advantageous if correspondingly thin films composed of the respective layer materials are present. The thickness of the respective layers can be adapted in accordance with the requirements. Preferably the layer thickness in the finished thermoelectric material sandwich for protective layers and electrical contacts is 100 μm to 5 mm.

The films preferably used according to the invention have a larger layer thickness by comparison, such that a change in length of the film can occur during pressing or rolling.

The protective layers and electrical contacts are metals, semimetals, semiconductors, graphites, graphene, or consist of at least one chemical element of the thermoelectric materials.

The method according to the invention can be carried out continuously or batchwise. Pressing is normally effected batchwise. By contrast, preference is given to rolling that can be carried out continuously on a strip of the thermoelectric material.

Different rolling processes are conceivable for rolling. In the simplest case, a plurality of layers are compressed by one roller and the layers are connected to the material in the process. It is also possible for a plurality of rollers to be used simultaneously or in succession.

In accordance with one embodiment of the invention, after rolling or pressing, a heat treatment of the thermoelectric material sandwich can be effected without pressure or under pressure. The heat treatment can serve to compensate for mechanical stresses that may be present in the component. Heat treatment under pressure is possible, but not absolutely necessary.

The topmost layer can be directly the metallic contact via which the legs in the final construction are electrically contact-connected in series. The nature and the number of the layers depend on the respective requirements in the further module construction process and also on the thermoelectric material and are not subject to any limitation. Preferably, one or a plurality of layers, in particular 1 to 5 layers, are applied by the method according to the invention.

According to the invention, after rolling or pressing and, if appropriate, heat treatment, individual legs can be sawn or cut from the thermoelectric material sandwich thus obtained, which legs can then be used in the thermoelectric module construction. The sawing or cutting can be carried out by means of conventional known methods. Examples include conventional sawing, laser cutting, water jet cutting, etc. In addition to the method being carried out simply and primarily continuously, a further advantage of the method is the resultant plane-parallelism of the legs and the leg height that can be set exactly. For incorporation into a thermoelectric module it is particularly advantageous for geometric reasons, for all of the legs to have the same height and plane-parallel end faces. This enables contact to be made with a substrate in an efficient manner.

In the method according to the invention, the thermoelectric material can simultaneously contain p- and n-conducting thermoelectric materials in such a geometry that permits subsequent sawing or cutting into individual legs of the thermoelectric material, which legs can then be used in the thermoelectric module construction. As a result, p- and n-type material series can also be pressed in one work process and subsequently be separated again by sawing into the individual fully trimmed and fabricated legs. In this case too, the high geometric quality of the p- and n-type legs is advantageous, which has a favorable effect on incorporation in the thermoelectric module.

According to the invention, the thermoelectric material can simultaneously contain p- and n-conducting thermoelectric materials, the mixing of which is prevented by means of spacers introduced perpendicularly to the layer sequence between the p- and n-conducting thermoelectric materials. The spacer should accordingly be introduced perpendicularly to the layer construction. It is intended to prevent mixing or merging or diffusion of p- and n-type materials The spacer is preferably an electrically insulating material, which preferably contains ceramic, glass, mica, organic or natural polymers. Its thickness is preferably 0.1 mm to 5 cm.

In this case, the spacer can be removed after rolling or pressing by being sawn, cut, burned or decomposed from the thermoelectric material sandwich or by being dissolved therefrom by means of a solvent.

Furthermore, the spacer can be used in a targeted manner as a separator between the p- and n-type legs of a module. As a result, during the contact-connecting or rolling process, it is possible to produce not only a sandwich plate for leg production, but directly a thermoelectric module base body composed of alternating p- and n-type legs. However, this presupposes that the topmost or bottommost layer, the substrate, is not a simple metal plate, but rather has a structuring which electrically conductively connects p- and n-type legs respectively to one another, but provides electrical insulation therebetween. This corresponds to the traditional module construction. Accordingly, the contact films supplied superficially onto the thermoelectric materials can be structured in such a way that conductive and non-conductive regions are produced on the thermoelectric material sandwiches, the entire construction corresponding to the design of a thermoelectric module.

Furthermore, the spacer can be a matrix for the thermoelectric module where powders, melt or finished thermoelectric legs, bars or plates are introduced by filling and the protective layers and contacts can subsequently be applied by rolling or pressing.

The spacer can be an organic polymer or an electrically insulated material such as glass, mica, ceramic or a combination thereof.

The thermoelectric material per se can be based on any suitable thermoelectric materials. The thermoelectric material is preferably based on lead tellurides.

The semiconductor materials can be joined together to form thermoelectric generators or Peltier arrangements according to methods which are known per se and are described for example in WO 98/44562, U.S. Pat. No. 5,448,109, EP-A-1 102 334 or U.S. Pat. No. 5,439,528.

The invention also relates to the use of rollers for applying at least one layer, selected from diffusion barriers, further protective layers, adhesion promoters, solders and contacts, onto the thermoelectric materials.

The thermoelectric generators or Peltier arrangements produced according to the invention are preferably used as a heat pump, for climate control of seating furniture, vehicles and buildings, in refrigerators and (laundry) driers for simultaneous heating and cooling of substance streams in processes for substance separation such as absorption, drying, crystallization, evaporation or distillation, as a generator for utilization of heat sources such as solar energy, geothermal heat, heat of combustion of fossil fuels, waste heat sources in vehicles and stationary units, heat sinks in the evaporation of liquid sustances or biological heat sources, or for cooling electronic components.

The invention claimed is:

1. A method for applying at least one diffusion barrier and at least one layer selected from a further protective layer, an adhesion promoter, a solder, and an electrical contact, simultaneously onto a thermoelectric material in one work process, the method comprising:
    rolling or pressing the diffusion barrier and the at least one layer onto the thermoelectric material at a temperature at which the thermoelectric material is malleable, to form a thermoelectric material sandwich,
    wherein thin films comprising material of the diffusion barrier and material of the at least one layer are placed onto the thermoelectric material prior to the rolling or pressing.

2. The method of claim 1, further comprising, after the rolling or pressing:
    heat treating the thermoelectric material sandwich obtained after the rolling or pressing.

3. The method of claim 2, wherein the heat treating is carried out without an applied pressure.

4. The method of claim 2, wherein the heat treating is carried out with an applied pressure.

5. A method of producing a part suitable for thermoelectric module production, the method comprising, after the rolling or pressing:
    sawing or cutting individual slices from the thermoelectric material sandwich obtained by the method of claim 1.

6. The method of claim 5, wherein the thermoelectric material sandwich has been heat treated before the sawing or cutting.

7. The method of claim 1, wherein the thermoelectric material comprises p- and n-conducting thermoelectric materials in such a geometry that permits subsequent sawing or cutting into individual legs of the thermoelectric material, which legs are suitable for thermoelectric module construction.

8. The method of claim 1, wherein the thermoelectric material comprises p- and n-conducting materials, mixing of which is prevented by at least one spacer introduced perpendicularly to a layer sequence between the p- and n-conducting thermoelectric materials.

9. The method of claim 8, wherein the spacer is an electrically insulating material.

10. The method of claim 9, wherein the spacer comprises at least one selected from the group consisting of ceramic, glass, mica, an organic polymer, and a natural polymer.

11. The method of claim 8, wherein the spacer has a thickness of 0.1 mm to 5 cm.

12. The method of claim 8, wherein the spacer is removed after the rolling or pressing by being sawn, cut, burned, or decomposed from thermoelectric material sandwich obtained after the rolling or pressing,
    or by being dissolved by a solvent.

13. The method of claim 1, wherein at least one contact film applied superficially onto the thermoelectric material, and is structured in such a way that conductive and non-conductive regions are produced on the thermoelectric material sandwich obtained after the rolling or pressing,
    wherein an entire construction corresponds to a design of a thermoelectric module.

14. The method of claim 1, wherein the thermoelectric material comprises a lead telluride.

15. The method of claim 1, wherein the at least one layer comprises a further protective layer.

16. The method of claim 1, wherein the at least one layer comprises an adhesion promoter.

17. The method of claim 1, wherein the at least one layer comprises a solder.

18. The method of claim 1, wherein the at least one layer comprises an electrical contact.

19. A method of producing plane parallel legs in a thermoelectric material sandwich, the method comprising:
    sawing or cutting individual legs into the thermoelectric material sandwich obtained by the method of claim 1,
    wherein the legs are plane parallel.

20. The method of claim 19, wherein an ultimate height of the legs is adjusted by the rolling or pressing.

* * * * *